United States Patent [19]

Huijsing et al.

[11] Patent Number: 5,311,145

[45] Date of Patent: May 10, 1994

[54] COMBINATION DRIVER-SUMMING CIRCUIT FOR RAIL-TO-RAIL DIFFERENTIAL AMPLIFIER

[75] Inventors: Johan H. Huijsing, Schipluiden, Netherlands; John P. Tero, Saratoga, Calif.

[73] Assignee: North American Philips Corporation, New York, N.Y.

[21] Appl. No.: 36,774

[22] Filed: Mar. 25, 1993

[51] Int. Cl.⁵ ............................ H03F 3/45; H03F 3/18
[52] U.S. Cl. ..................................... 330/255; 330/261
[58] Field of Search ............... 330/252, 253, 257, 255, 330/261

[56] References Cited

U.S. PATENT DOCUMENTS

| | | | |
|---|---|---|---|
| 4,555,673 | 11/1985 | Huijsing et al. | 330/258 |
| 4,766,394 | 8/1988 | Yukawa | 330/253 |
| 4,797,631 | 1/1989 | Hsu et al. | 330/253 |
| 4,810,339 | 1/1989 | Tanimoto | 330/253 |
| 4,893,091 | 1/1990 | Lillis et al. | 330/253 |
| 4,918,398 | 4/1990 | Huijsing | 330/252 |
| 4,958,133 | 9/1990 | Bazes | 330/253 |

OTHER PUBLICATIONS

J. H. Huising et al in the IEEE JSSC, vol. SC-20, No. 6, Dec. 1985, entitled, "Low Voltage Operational Amplifier with Rail-to-Rail Input and Output Ranges".
D. M. Monticelli entitled "A Quad CMOS Single-Supply Op Amp with Rail-to-Rail Output Swing", in the IEEE JSSC, vol. SC-21, No. 6, Dec., 1986.

Primary Examiner—Steven Mottola
Assistant Examiner—Tiep Nguyen
Attorney, Agent, or Firm—Bernard Franzblau

[57] ABSTRACT

A combination driver/summing circuit for rail-to-rail operation of a differential amplifier includes a differential amplifier input stage that amplifies an input signal and a current control circuit that regulates the operating currents through the active elements of the differential amplifier input stage. A summing circuit divided into first and second segments and supplied with current from a single common floating current source combines internal currents supplied by the differential amplifier input stage. A class A-B driver/output stage is coupled to the summing circuit to derive at least one output signal representative of the input signal and which is operative over nearly the full rail-to-rail supply voltage range.

17 Claims, 2 Drawing Sheets

COMBINATION DRIVER-SUMMING CIRCUIT FOR RAIL-TO-RAIL DIFFERENTIAL AMPLIFIER

BACKGROUND OF THE INVENTION

The present invention relates generally to the field of differential amplifiers and operational amplifiers and more particularly to an amplifier of this kind fabricated in integrated circuit technology and having a rail-to-rail common mode range at the amplifier input and output.

There are times when an operational amplifier is required which can linearly amplify an input signal over nearly the full supply voltage range, especially in the case of a supply voltage as low as 1.5 volts. Operational amplifiers to be used with low supply voltages should utilize as much as possible of the available supply voltage range in order to obtain the best signal-to-noise ratio. This requirement is especially severe in the case of low power applications or when the supply voltage is low as in battery powered systems.

U.S. Pat. No. 4,555,673 issued Nov. 26, 1985 in the name of J.H. Huijsing et al and an article by J.H. Huijsing et al in the IEEE JSSC, vol. SC-20, No. 6, 12/85, entitled "Low Voltage Operational Amplifier with Rail-to-Rail Input and Output Ranges", describe circuits which generally work well to amplify an input signal while using a large part of the supply voltage range. The Huijsing et al article describes an operational amplifier having rail-to-rail input, a so-called folded cascode stage and a rail-to-rail class A-B output stage. The input stage with a rail-to-rail common-mode input voltage range provides a constant transconductance over the full common-mode range. However, this operational amplifier also requires an intermediate stage to increase the gain and a completely separate class A-B quiescent bias network. Another disadvantage of the Huijsing et al operational amplifier is that it requires a fairly large number of integrated circuit components.

In the Huijsing et al patent and article the rail-to-rail common-mode voltage swing at the amplifier input is obtained by using two differential amplifier input stages in parallel and operating same such that the common mode (CM) voltage of one stage can reach the positive supply voltage rail and that of the other the negative supply voltage rail. Three common-mode input voltage ranges are present in these circuits. In a first range, which extends from the negative supply voltage to an intermediate range, only one differential amplifier input stage is operative. In a second range extending from the positive supply voltage to the intermediate range, the other differential amplifier input stage is operative. In the intermediate range, both differential amplifier stages are in operation.

The Huijsing et al patent describes an improved differential amplifier with a rail-to-rail input capability which attempts to correct the problem of a variation in the amplifier transconductance as the input common-mode voltage varies across the supply voltage range. The patent describes a current steering control circuit that regulates the operating currents for the two differential amplifiers such that the overall amplifier transconductance is controlled to be substantially constant as the common-mode voltage of the amplifier input signal varies across the supply voltage range. A summing circuit selectively combines internal currents supplied by the two differential amplifiers so as to derive at least one output signal representative of the input signal.

Another prior art operational amplifier is described in an article by D.M. Monticelli entitled "A Quad CMOS Single-Supply Op Amp with Rail-to-Rail Output Swing, in the IEEE JSSC, Vol. SC-21, No. 6, December 1986. This article describes a Quad CMOS amplifier which includes a class A-B output stage with quiescent current biasing. This op-amp circuit does not have a rail-to-rail input and does not use a folded cascode arrangement. It also requires two independent matched internal current sources for class AB quiescent current biasing so that any mismatch therebetween will result in a contribution to the input offset voltage. Furthermore, the Monticelli circuit does not eliminate the dependence of the quiescent bias current in the output transistors of the class A-B output stage on the voltage supply.

Further background information can be obtained from a review of U.S. Pat. Nos. 4,893,091 (Jan. 9, 1990); 4,958,933 (Sep. 18, 1990) and 4,797,631 (Jan. 10, 1989) U.S. Pat. No. 4,797,631 describes a rail-to-rail input stage and folded cascode stage. The circuit does not include a class A-B output stage or floating current source. Although this patent shows an input stage and a folded cascode stage, it does not include the current steering transistor of the Huijsing et al patent in the differential input stage and which transfers current from one current source transistor to the other as the input signal traverses the input common mode range. Thus, it does not maintain a constant current gain in the input stage, as is accomplished in the op-amp described in Huijsing et al patent discussed above.

U.S. Pat. No. 4,958,133 also describes a rail-to-rail input stage and a folded cascode stage, but again does not include a class A-B output stage, floating current source or current steering transistors in the input stage. A disadvantage of this circuit is that it does not maintain the bias currents constant.

U.S. Pat. No. 4,893,091 describes an amplifier with a class A-B output stage. However, this patent uses an intermediate gain stage between the input and output and wherein the output is a common collector driver. The requirement of an intermediate amplifier stage is a major disadvantage of this patent.

SUMMARY OF THE INVENTION

Accordingly, it is an object of the invention to provide a combined driver and summing circuit for a rail-to-rail operational amplifier which avoids the above enumerated disadvantages of prior art operational amplifiers.

Another object of the invention is to provide an improved operational amplifier which is simple and inexpensive and provides a high gain without the use of an intermediate gain stage.

A further object of the invention is to provide an operational amplifier in which the input offset and noise voltage are of the same low level as in the case where an intermediate gain stage was employed.

A still further object of the invention is to provide an operational amplifier circuit in which the quiescent current in the output transistors is relatively independent of the supply voltage and of the input common mode voltage.

In accordance with the present invention, the above objects are achieved by the provision of a combination driver and summing circuit for a rail-to-rail operational amplifier that includes a rail-to-rail input stage composed of a pair of input differential amplifiers made up of complementary field effect transistors. The input stage may also include a current steering network. A summing circuit is provided which combines the internal currents supplied by the input differential amplifiers. A class A-B driver output stage is supplied with signal currents by the summing circuit and produces in turn one or more output signal currents as a function of an input signal received by the pair of input differential amplifiers. The class A-B driver output stage includes a pair of complementary control transistors coupled in parallel to control electrodes of the output transistors. The summing circuit comprises a folded cascode stage that includes a floating current source which provides a constant quiescent bias current for the output transistors of the class A-B output stage which is independent of the supply voltage, and which also is constant even if the common mode input voltage swings from rail to rail, which causes the complementary input stage to alternatively dump positive and negative bias current into the summing circuit.

The present invention maintains the quiescent bias current in the class A-B output stage constant by using the floating current source to compensate for the finite output impedance of the class A-B bias control transistors. An intermediate amplifier stage is eliminated by the use of the folded cascode summing circuit stage with class A-B bias control transistors which present a high impedance to signal currents. A further feature is the provision of a constant current gain in the input stage. The invention provides operating characteristics equal to or superior to the prior art circuits and accomplishes this on an integrated circuit chip that is substantially smaller in size than that which is required by the known circuits. The provision of the folded cascode stage with a single floating current source eliminates the current mismatch problem in the Monticelli quad CMOS operational amplifier.

BRIEF DESCRIPTION OF THE DRAWINGS

For a more complete understanding of the present invention and the advantages thereof, reference will now be made to the following description taken in conjunction with the accompanying drawing which schematically illustrates a combination driver and summing circuit for a rail-to-rail operational amplifier, in which.

DESCRIPTION OF THE PREFERRED EMBODIMENTS

Figure 1:
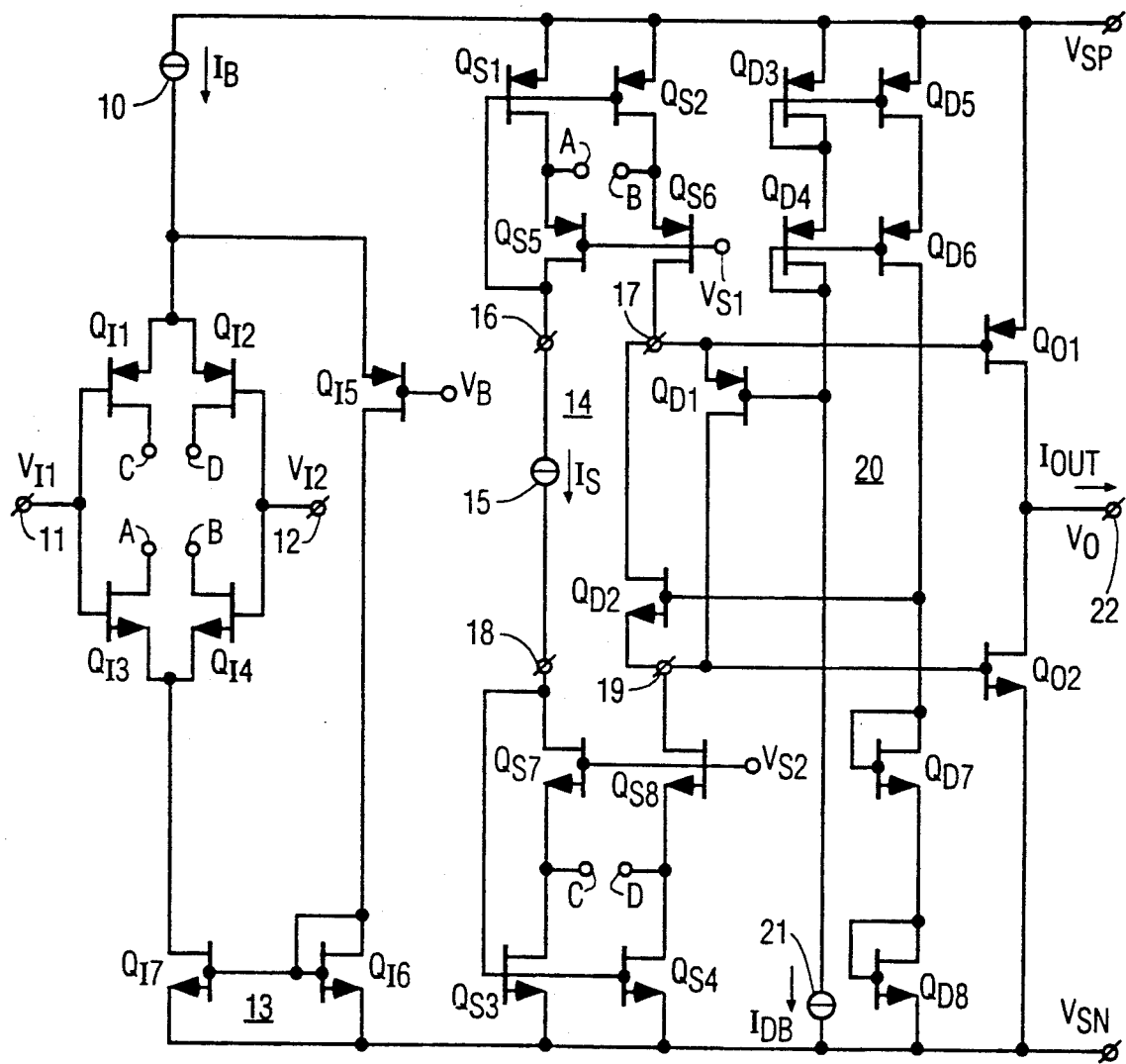
FIG. 1 is a schematic circuit diagram of a differential amplifier in accordance with the invention.

Referring now to the drawings, FIG. 1 shows a combined class A-B driver and summing circuit for a rail-to-rail operational amplifier. A differential amplifier input stage comprises a first differential amplifier consisting of a first pair of P-channel field effect transistors $Q_{11}$ and $Q_{12}$ having their source electrodes connected in common to the positive rail $V_{SP}$ of the supply voltage via a current source 10 which supplies a constant current $I_S$. A second input differential amplifier consisting of a second pair of field effect transistors $Q_{13}$ and $Q_{14}$ of the N-channel type have their source electrodes connected together to the drain electrode of a field effect transistor $Q_{17}$. The source electrode of $Q_{17}$ is connected to the negative supply voltage rail $V_{SN}$. The gate electrodes of transistors $Q_{11}$ and $Q_{13}$ are connected in common to a first signal input terminal 11 and the gate electrodes of transistors $Q_{12}$ and $Q_{14}$ are connected in common to a second signal input terminal 12. The input terminals 11 and 12 receive a differential input signal represented by voltages $V_{11}$ and $V_{12}$ in the drawing.

A current control circuit which steers current through the input transistors $Q_{11}$-$Q_{14}$ includes a control transistor $Q_{15}$ having its source electrode connected to a junction point between the current source 10 and the common connection of the source electrodes of field effect transistors $Q_{11}$ and $Q_{12}$. The drain electrode of field effect transistor $Q_{15}$ is connected to the drain electrode of a diode-connected field effect transistor $Q_{16}$ whose source electrode is connected to the negative supply voltage rail $V_{SN}$. The gate electrodes of transistors $Q_{16}$ and $Q_{17}$ are connected together so that transistors $Q_{16}$ and $Q_{17}$ together function as a current mirror circuit 13. The gate electrode of current control transistor $Q_{15}$ is connected to a terminal supplying a bias voltage Vs.

When the common mode input voltage $(V_{11}+V_{12})/2$ is below the voltage $V_B$ at the gate of the current steering control transistor $Q_{15}$, the P-channel input differential amplifier pair $Q_{11}$ and $Q_{12}$ is active, which allows the common mode range to include the negative supply voltage $V_{SN}$. Conversely, when the common mode input voltage is higher than the gate bias voltage $V_B$, the control transistor $Q_{15}$ steers the tail current $I_B$ away from the transistor pair $Q_{11}$, $Q_{12}$ and directs it instead through the diode-connected transistor $Q_{16}$ of the current mirror circuit 13. By means of the current mirror action, a tail current now flows through transistor $Q_{17}$ from the input transistor pair $Q_{13}$, $Q_{14}$. This allows the common mode range to include the positive supply voltage $V_{SP}$.

Transistors $Q_{11}$-$Q_{14}$ are all turned on when the common mode voltage $(V_{CM})$ is in a middle range, whereas transistors $Q_{11}$ and $Q_{12}$ are conductive when $V_{CM}$ is in a low range extending from the bottom of the middle range to the negative supply voltage $V_{SM}$. The opposite pair of input transistors $Q_{13}$ and $Q_{14}$ are conductive when $V_{CM}$ is in the high range extending between the top of the middle range and the positive supply voltage rail $V_{SP}$.

The output currents of the four input transistors $Q_{11}$ $Q_{14}$ are added in the summing circuit 14, which includes the field effect transistors $Q_{S1}$ $Q_{S8}$ and a common floating current source 15 which produces a current Is. The summing circuit is composed of two segments. The top half of the summing circuit comprises two series connected field effect transistors $Q_{S1}$ and $Q_{S5}$ coupled between the positive supply voltage rail $V_{SP}$ and a terminal 16 of the single floating current source 15. A second pair of field effect transistors $Q_{S2}$ and $Q_{S6}$ are serially connected between the positive rail $V_{SP}$ and the terminal 17. The gate electrodes of transistors $Q_{S1}$ and $Q_{S2}$ are connected together as are the gate electrodes of transistors $Q_{S5}$ and $Q_{S6}$. The gate electrodes of transistors $Q_{S1}$ and $Q_{S2}$ are also directly connected to terminal 16 and the gate electrodes of transistors $Q_{S5}$ and $Q_{S6}$ are connected to a terminal which supplies a bias voltage $V_{S1}$.

The common node labelled A between transistors $Q_{S1}$ and $Q_{S5}$ is connected by a connection (not shown) to the drain electrode of input transistor $Q_{13}$. This connection is indicated by showing the drain of transistor $Q_{13}$ connected to a node also labelled A. In a similar manner, the common node B between transistors $Q_{S2}$ and $Q_{S6}$ is connected to the drain electrode of input transistor $Q_{14}$, which is indicated by labelling the latter electrode B. The top half segment of the summing circuit constitutes a current mirror circuit.

The bottom half segment of the summing circuit includes field effect transistors $Q_{S7}$ and $Q_{S3}$ serially connected between terminal 18 of the current source and the negative supply voltage rail $V_{SN}$. In addition, field effect transistors $Q_{S8}$ and $Q_{S4}$ are serially connected between a terminal 19 of the summing circuit and the negative voltage rail. The gate electrodes of transistors of $Q_{S3}$ and $Q_{S4}$ are connected in common to the terminal 18 and the gate electrodes of transistors $Q_{S7}$ and $Q_{S8}$ are connected in common to a terminal which supplies a bias voltage $V_{S2}$.

The common junction points C and D between transistors $Q_{S7}$ and $Q_{S3}$ and between transistors $Q_{S8}$ and $Q_{S4}$, respectively, are connected to the drain electrodes of input transistors $Q_{11}$ and $Q_{12}$, respectively, as indicated by the circuit points labelled C and D of the input transistors. The bottom half of the summing circuit also constitutes a current mirror circuit.

A class A-B bias control and rail-to-rail output stag 20 is connected to terminals 17 and 19 and includes field effect transistors $Q_{D1}$–$Q_{D8}$, output field effect transistors $Q_{O1}$ and $Q_{O2}$ and a current source 21 providing a current $I_{DB}$. An output current is derived at output terminal 22. A complementary pair of class A-B bias control transistors $Q_{D1}$ and $Q_{D2}$ are connected in parallel, i.e. head-to-tail, to the terminals 17 and 19 and supply drive currents $I_{D1}$ and $I_{D2}$ in parallel to the output field effect transistors $Q_{O1}$ and $Q_{O2}$, respectively.

The output transistors $Q_{O1}$ and $Q_{O2}$ are serially connected between the supply voltage rails $V_{SP}$ and $V_{SN}$ and have their drain electrodes connected in common to the output terminal 22. The gate of transistor $Q_{O1}$ is connected to terminal 17 and the gate of transistor $Q_{O2}$ to the terminal 19.

Diode-connected field effect transistors $Q_{D3}$ and $Q_{D4}$ are serially connected with current source 21 between the supply voltage rails $V_{SP}$ and $V_{SN}$. Field effect transistors $Q_{D5}$ and $Q_{D6}$ are serially connected with diode-connected field effect transistors $Q_{D7}$ and $Q_{D8}$ between the positive and negative supply voltage rails. The gate electrodes of transistors $Q_{D3}$ and $Q_{D5}$ are connected together as are the gate electrodes of transistors $Q_{D4}$ and $Q_{D6}$. The top half of this circuit also forms a current mirror network.

The gate electrode of transistor $Q_{D1}$ is connected to a junction between diode $Q_{D4}$ and the current source 21 and the gate electrode of transistor $Q_{D2}$ is connected to a junction between transistor $Q_{D6}$ and diode $Q_{D7}$.

As described in U.S. Pat. No. 4,555,673, which is hereby incorporated by reference, the current steering control circuit consisting of the current source 10, the control transistor $Q_{15}$ and the current mirror circuit 13 operates over the signal input range so as to control the current distribution in the input transistors $Q_{11}$–$Q_{14}$ and hence the currents in the branches of the summing circuit 14. When the common-mode input voltage is below the reference voltage $V_B$ at the gate of control transistor $Q_{15}$, the differential amplifier input pair $Q_{11}$ and $Q_{12}$ are conductive over the low range extending from the negative supply voltage $V_{SN}$ to the bottom of the middle range. The input transistors $Q_{13}$ and $Q_{14}$ are cut-off in the low range. Conversely, when the common-mode input voltage is higher than the bias voltage $V_B$, the control transistor $Q_{15}$ redirects the current $I_B$ away from input transistors $Q_{11}$ and $Q_{12}$, which are then non-conductive, and directs it instead to input transistors $Q_{13}$ and $Q_{14}$ via the current mirror circuit 13. The common-mode range, i.e. the high range, now includes the positive supply voltage $V_{SP}$. In between the high and low ranges is a middle range in which all four input transistors are allowed to conduct. The foregoing operation is described in greater detail in U.S. Pat. No. 4,555,673.

The output currents of the four input transistors are added together in the summing circuit 14 consisting of transistors $Q_{S1}$–$Q_{S8}$. The current mirror circuits $Q_{S1},Q_{S2}$ and $Q_{S3},Q_{S4}$ mirror the currents at circuit points A and C and adds these currents to the currents at the circuit points B and D so as to provide drive currents for the driver output stage 20.

The output transistors $Q_{O1}$ and $Q_{O2}$ are driven in parallel by driver currents $I_{D1}$ and $I_{D2}$. The class AB driver control transistors $Q_{D1}$ and $Q_{D2}$ are connected so that the common-mode component of the driver currents is unattenuated. The common-mode current drives the output transistor $Q_{O1}$ or $Q_{O2}$ or both transistors. The bias control transistors, however, control the differential-mode component of the driver currents such that class AB operation of the output transistors is obtained and with a low quiescent current through these transistors when there is no differential mode component in the driver current.

In the quiescent condition, output transistor $Q_{O1}$ is biased by the sum of the gate-source voltages of transistors $Q_{D3}$ and $Q_{D4}$ minus the gate-source voltage of transistor $Q_{D1}$, i.e. $V_{GSO1} = B_{GSD3} + V_{GSD4} - V_{GSD1}$. Similarly for output transistor $Q_{O2}$, $V_{GSD2} = V_{GSD7} + V_{GSD8} - V_{GSD2}$.

When a positive output current flows, the current in the output transistor $Q_{O1}$ is increased while that in output transistor $Q_{O2}$ is decreased. The decrease of the gate-source voltage of transistor $Q_{O2}$ is controlled by the increase of the gate-source voltage of transistor $Q_{D2}$. The source of transistor $Q_{D2}$ draws the drive current away from the gate of transistor $Q_{O2}$ while this drive current is added to that of the gate of transistor $Q_{O1}$.

In order to provide a constant quiescent current in the summing and bias control circuit that is independent of which pair of input transistors is operating, it is possible to connect a first current source (e.g. $I_{S1}$) to terminal 16 and a second current source (e.g. $I_{S2}$) to terminal 18. Thus, the upper and lower current mirror circuits in the summing circuit would be individually driven by the first and second current sources, respectively. A disadvantage of this solution is that any inequality of the currents $I_{S1}$ and $I_{S2}$ would contribute to the input offset and noise voltage.

The provision of a single common floating current source 15, as shown, produces superior performance in that it maintains a constant quiescent current while avoiding the disadvantages associated with the use of two separate current sources for the upper and lower sections of the summing circuit.

The present invention thus provides a superior operational amplifier including an output class A-B bias control stage and a floating current source to bias the cascode summing circuit stage thereby to provide a constant quiescent bias current for the output transistors of the class A-B stage. The amplifier includes a current steering transistor network in the differential amplifier input stage which transfers current therebetween as the input signal traverses the input common-mode range, thereby maintaining a constant current gain in the input stage, another important characteristic for an operational amplifier.

The floating current source maintains constant bias currents so as to compensate for the output impedance of the class A-B bias control transistors. The intermediate amplifier stage required by the prior art is eliminated by means of the invention. Rail-to-rail operation is provided and the operational amplifier can be accommodated on an integrated circuit chip that is smaller than commercially available devices. This is made possible by the floating current source and the class A-B bias control transistors within the cascode stage thereby eliminating the intermediate gain stage and complicated class A-B control of the prior art circuits.

Figure 2:
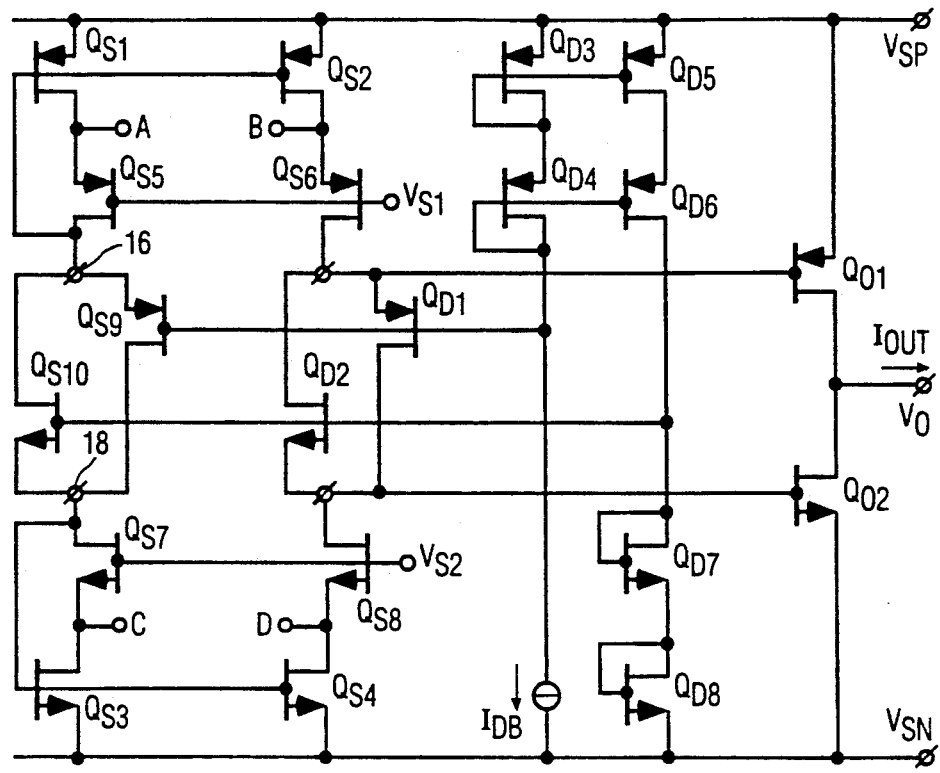
FIG. 2 is a circuit diagram showing a preferred embodiment of the floating current source, class A-B bias control and the output stage in the amplifier of FIG. 1.

FIG. 2 shows an improvement of the circuit of FIG. 1 in which the floating current source is made up of complementary field effect transistors $Q_{S9}$ and $Q_{S10}$ connected in parallel between terminals 16 and 18 of the summing circuit. The gate electrode of transistor $Q_{S9}$ is connected to the gate electrode of driver control transistor $Q_{D1}$ and the gate of transistor $Q_{S10}$ is connected to the gate of driver control transistor $Q_{D2}$. The remainder of the circuit is similar to the circuit of FIG. 1 and corresponding elements are identified by means of the same reference labels as are used in FIG. 1. The input stage and the current steering circuit are omitted for the sake of brevity. In this embodiment, the current from the floating current source is slightly dependent on the voltage supply through the output impedance of $Q_{S9}$ and $Q_{S10}$. As the voltage supply changes, the change in current compensates for the output impedance of $Q_{D1}$ and $Q_{D2}$ so as to maintain the gate-source voltage $V_{GS}$ ($Q_{D1}$ and $Q_{D2}$) constant, which in turn reduces the dependence of the quiescent bias current in the output stage on the voltage supply. This latter feature is extremely important where a battery is used as the supply voltage source.

Figure 3:
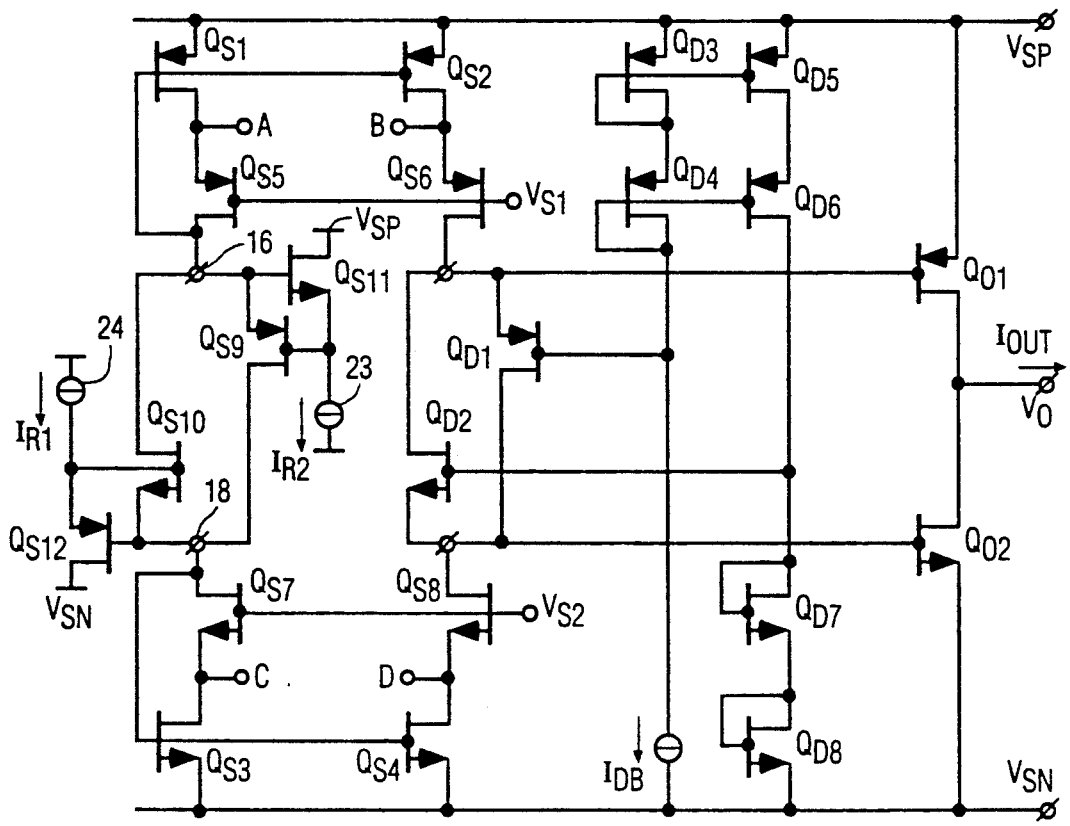
FIG. 3 is a circuit diagram in which the floating current source is biased independently of the bias control circuit.

FIG. 3 shows a further modification of the operational amplifier circuit of FIG. 1 in which the floating current source is independently biased from the driver circuit. A pair of complementary field effect transistors $Q_{S9}$ and $Q_{S10}$ are connected in parallel between the terminals 16 and 18 with connections similar to those of the driver control transistors $Q_{D1}$ and $Q_{D2}$. An N-channel field effect transistor $Q_{S11}$ is connected in series with a source of reference current 23 to the positive supply voltage rail $V_{SP}$ at the drain of transistor $Q_{S11}$. The gate electrode of transistor $Q_{S9}$ is connected to the source electrode of transistor $Q_{S11}$ and the gate of transistor $Q_{S11}$ is connected to the source electrode of transistor $Q_{S9}$.

In a similar manner, a P-channel field effect transistor $Q_{S12}$ is connected in series with a source of reference current 24 to the negative supply voltage rail coupled to the drain electrode of transistor $Q_{S12}$. The gate of transistor $Q_{S10}$ is connected to the source electrode of transistor $Q_{S12}$ and the gate of transistor $Q_{S12}$ is connected to the source electrode of transistor $Q_{S10}$.

The floating current source described immediately above is biased independently of the driver circuit. As in FIG. 2, the differential amplifier input circuit and the current steering network have been omitted from FIG. 3 for the sake of brevity. Elements similar to those in FIGS. 1 and 2 have the same reference labels. Aside from the differences in the floating current source, the circuits of FIGS. 2 and 3 otherwise operate in a manner similar to that of the circuit of FIG. 1.

While the invention has been described with reference to particular embodiments thereof, this description is solely for the purpose of illustration and is not to be construed as limiting the scope of the invention claimed below. For example, semiconductor elements of opposite polarity to those described above may be employed to accomplish the same results. Alternatively, bipolar transistors could be used instead of the field effect transistors described herein. Thus, various modifications and changes may be made by those skilled in the art without departing from the true scope and spirit of the invention as defined by the appended claims.

What is claimed is:

1. A differential amplifier with rail-to-rail common-mode range comprising:
   a positive supply voltage rail,
   a negative supply voltage rail,
   first and second amplifier input terminals for receiving a signal to be amplified,
   differential amplifier means comprising input means coupled to said first and second amplifier input terminals, output means, a first pair of transistors connected as a first differential amplifier to said positive supply voltage rail via a first current source, and a second pair of transistors connected as a second differential amplifier to said negative supply voltage rail via a second current source,
   a current summing circuit coupled to the output means of the differential amplifier means,
   a driver/output stage including first and second output transistors coupled to signal output terminal and having input means coupled to the current summing circuit, and
   a floating current source coupled to said summing circuit in a manner so as to control and to maintain a constant quiescent bias current in the output transistors.

2. A differential amplifier as claimed in claim 1 wherein said current summing circuit comprises a first current mirror circuit coupled between the positive supply voltage rail and a first terminal of the floating current source and a second current mirror circuit coupled between the negative supply voltage rail and a second terminal of the floating current source.

3. A differential amplifier as claimed in claim 2 wherein the driver/output stage comprises said first and second output transistors connected in series circuit between the positive and negative supply voltage rails and first and second bias control transistors connected in parallel between a first terminal of the first current mirror circuit and a first terminal of the second current mirror circuit, and means coupling a control electrode of the first output transistor to said first terminal of the first current mirror circuit and a control electrode of the second output transistor to the first terminal of the second current mirror circuit.

4. A differential amplifier as claimed in claim 3 wherein the source and drain of the first bias control transistor is connected to the drain and source, respectively, of the second bias control transistor.

5. A differential amplifier as claimed in claim 2 wherein the first current mirror circuit comprises first and second transistors having their control electrodes connected in common to a DC reference voltage and the second current mirror circuit comprises third and fourth transistors having their control electrodes connected in common to a further DC reference voltage.

6. A differential amplifier as claimed in claim 2 wherein the driver/output stage comprises first and second complementary bias control transistors connected in parallel between a first terminal of the first current mirror circuit and a first terminal of the second current mirror circuit, and said floating current source comprises third and fourth complementary transistors connected in parallel between said first and second terminals of the floating current source.

7. A differential amplifier as claimed in claim 1 wherein the driver/output stage comprises a current mirror circuit having a first circuit branch connected in series with a further current source between said positive and negative supply voltage rails and a second circuit branch connected in a second series circuit with at least one diode element between said positive and negative supply voltage rails.

8. A differential amplifier as claimed in claim 7 wherein said current summing circuit comprises a first current mirror circuit coupled between the positive supply voltage rail and a first terminal of the floating current source and a second current mirror circuit coupled between the negative supply voltage rail and a second terminal of the floating current source, and wherein
the driver/output stage further comprises first and second complementary bias control transistors connected in parallel between a first terminal of the first current mirror circuit and a first terminal of the second current mirror circuit, and
means coupling a control electrode of the first bias control transistor to a first junction point between the first circuit branch of the current mirror circuit and said further current source and coupling a control electrode of the second bias control transistor to a second junction point between the second circuit branch of the current mirror circuit and said one diode element.

9. A differential amplifier as claimed in claim 2 wherein the floating current source further comprises;
first and second complementary transistors connected in parallel between said first and second terminals of the floating current source,
a third transistor connected in series with a third current source to the positive supply voltage rail,
a fourth transistor connected in series with a fourth current source to the negative supply voltage rail, and
means coupling a control electrode of the first transistor and a control electrode of the second transistor to first and second junction points between the third transistor and third current source and between the fourth transistor and fourth current source, respectively.

10. A differential amplifier as claimed in claim 9 wherein the driver/output stage comprises first and second complementary bias control transistors connected in parallel between a first terminal of the first current mirror circuit and a first terminal of the second current mirror circuit.

11. A differential amplifier as claimed in claim 10 wherein the driver/output stage comprises said first and second output transistors connected in series circuit between the positive and negative supply voltage rails, and
means coupling a control electrode of the first output transistor to said first terminal of the first current mirror circuit and a control electrode of the second output transistor to the first terminal of the second current mirror circuit.

12. A differential amplifier as claimed in claim 1 further comprising;
a control transistor connected in series circuit with said first and second current sources between said positive and negative supply voltage rails and with a control electrode of the control transistor connected to a DC reference voltage.

13. A differential amplifier as claimed in claim 1 where the driver/output stage performs a biasing for class A-B operation.

14. A differential amplifier as claimed in claim 1 wherein the summing circuit comprises a folded cascode circuit arrangement.

15. A differential amplifier as claimed in claim 12, wherein the second current source comprises;
a current mirror circuit having a first circuit branch coupling said second pair of transistors to the negative supply voltage rail and a second circuit branch connected in series circuit with the control transistor and the first current source between said positive and negative supply voltage rails.

16. A differential amplifier comprising:
a positive supply voltage rail;
a negative supply voltage rail,
first and second amplifier input terminals for receiving a signal to be amplified,
a rail-to-rail input stage comprising a first differential amplifier pair coupled to said positive supply voltage rail via a first current source, and a second complementary differential amplifier pair coupled to said negative supply voltage rail via a second current source,
a current summing circuit,
means coupling input means of the input stage to said first and second amplifier input terminals and output means of the input stage to the current summing circuit,
a class AB biased driver/output stage including first and second complementary output transistors directly coupled to the current summing circuit and also coupled to signal output terminal of the differential amplifier, and
a floating current source coupled to said summing circuit in a manner so as to control and to maintain a constant quiescent bias current in the output transistors whereby the quiescent bias current is independent of current conduction in the first and second differential amplifier pairs and of an input common-mode voltage.

17. A differential amplifier as claimed in claim 16 further comprising a control circuit coupled to the first and second complementary differential amplifier pairs for steering currents through same in a manner so as to maintain a gain of the input stage constant over a full range of a current-mode voltage of a signal to be amplified at the amplifier input terminals.

* * * * *